US008547759B2

(12) United States Patent
Kadowaki

(10) Patent No.: US 8,547,759 B2
(45) Date of Patent: Oct. 1, 2013

(54) SEMICONDUCTOR DEVICE PERFORMING REFRESH OPERATION

(75) Inventor: Takuya Kadowaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 174 days.

(21) Appl. No.: 13/197,516

(22) Filed: Aug. 3, 2011

(65) Prior Publication Data

US 2012/0039133 A1 Feb. 16, 2012

(30) Foreign Application Priority Data

Aug. 11, 2010 (JP) ................................ 2010-180117

(51) Int. Cl.
*G11C 7/10* (2006.01)
*G11C 7/04* (2006.01)
*G11C 7/00* (2006.01)
*G11C 8/00* (2006.01)

(52) U.S. Cl.
USPC ................ 365/189.05; 365/189.07; 365/211; 365/222; 365/230.08; 365/236

(58) Field of Classification Search
USPC .......... 365/189.05, 189.07, 211, 222, 230.08, 365/236, 235
See application file for complete search history.

(56) References Cited

U.S. PATENT DOCUMENTS

| | | | | |
|---|---|---|---|---|
| 6,545,931 | B2 * | 4/2003 | Hidaka | 365/222 |
| 6,721,223 | B2 * | 4/2004 | Matsumoto et al. | 365/222 |
| 6,751,144 | B2 * | 6/2004 | Takahashi et al. | 365/222 |
| 7,088,632 | B2 * | 8/2006 | Pelley | 365/222 |
| 7,583,553 | B2 | 9/2009 | Mori | |

FOREIGN PATENT DOCUMENTS

| | | |
|---|---|---|
| JP | 2007-188635 | 7/2007 |
| JP | 2007-310983 | 11/2007 |

* cited by examiner

*Primary Examiner* — Trong Phan
(74) *Attorney, Agent, or Firm* — Morrison & Foerster LLP

(57) ABSTRACT

To provide a semiconductor device including a temperature detection circuit that detects a temperature of the semiconductor device and outputs temperature information, a counter circuit that takes a count of repeated inputs of a refresh command and outputs count information, a comparison circuit that activates a match signal when the temperature information matches the count information, and a refresh control circuit that controls whether to perform a refresh operation according to activation of the refresh command based on the match signal. According to the present invention, a refresh cycle can be finely adjusted because the repeated inputs of the refresh command are thinned out based on the temperature information. With this configuration, power consumption caused by the refresh operation can be reduced.

19 Claims, 9 Drawing Sheets

130

SEMICONDUCTOR DEVICE PERFORMING REFRESH OPERATION

BACKGROUND OF THE INVENTION

1. Field of the Invention

The present invention relates to a semiconductor device, and more particularly to a semiconductor device that performs a refresh operation in response to a refresh command supplied from outside.

2. Description of Related Art

A DRAM (Dynamic Random Access Memory) that is one of representative semiconductor devices stores therein information by electric charge charged in cell capacitors. Because the electric charge charged in the cell capacitors decays with a passage of time by a leakage current, it is necessary to perform a refresh operation at regular intervals so as to correctly hold the information. In the case of the DRAM, it is specified that information-holding time of the cell capacitors is equal to or longer than 64 ms according to the standards. Therefore, it suffices that the DRAM performs a refresh operation on all memory cells within a 64-ms period.

The information-holding time of the cell capacitors depends on temperature and tends to be longer at a lower temperature. Therefore, a refresh cycle can be set longer than 64 ms in a low temperature state, which can thereby reduce power consumption. For example, Japanese Patent Application Laid-open No. 2007-310983 discloses a technique of changing a cycle of generating an internal refresh signal according to temperature information in a self-refresh mode.

However, the technique disclosed in Japanese Patent Application Laid-open No. 2007-310983 has the following problems. Although power consumption can be reduced in the self-refresh mode, it is impossible to reduce power consumption in an auto-refresh mode in which a refresh operation is performed in response to a refresh command input from outside.

Meanwhile, Japanese Patent Application Laid-open No. 2007-188635 discloses a technique of executing one refresh operation whenever an auto-refresh command is input n times, where n is an integer, from outside. However, the method described in Japanese Patent Application Laid-open No. 2007-188635 has the following problems. An adjusted refresh cycle is n times longer than (an integer multiple of) the period (64 ms) specified according to the standards. Therefore, the refresh cycle cannot be finely adjusted. Furthermore, setting of a value of the n is made in response to a command from a fuse trimming unit or controller in manufacturing phase. Accordingly, for example, even if chip temperature changes, the refresh cycle cannot be automatically adjusted in a DRAM.

The conventional problems occur to not only the DRAM but also all other semiconductor devices that perform refresh operations in response to a refresh command input from outside of the devices. Moreover, the conventional problems occur similarly to a case of adjusting a refresh cycle in response to a change in the information holding time for reasons other than the reason related to temperatures.

SUMMARY

In one embodiment, there is provided a semiconductor device comprising: a temperature detection circuit that generates a temperature code based on a temperature of the semiconductor device; a counter circuit that updates a count value thereof each time a refresh command is issued; a comparison circuit that activates a match signal when the count value is coincident with a value of the temperature code; and a refresh control circuit that controls based on the match signal whether to perform a refresh operation in response to the refresh command.

In another embodiment, there is provided a semiconductor device comprising: a temperature detection circuit that generates a temperature code based on a temperature of the semiconductor device; a counter circuit that updates a count value thereof each time a refresh command is issued; a comparison circuit that activates a match signal when the count value is coincident with a value of the temperature code; and a refresh control circuit that performs a refresh operation when the refresh command is issued in a first operation mode and does not perform the refresh operation even when the refresh command is issued in a second operation mode, an operation mode of the refresh control circuit being changed from one of the first and second operation modes to other one of the first and second operation modes when the match signal is activated.

In still another embodiment, there is provided a semiconductor device comprising: a counter circuit that updates a count value thereof each time a refresh command is issued, the refresh command being issued P times, where P is an integer, in a predetermined period, and the count value being reset each time the refresh command is issued N times, where N is an integer smaller than P; a refresh control circuit that activates an internal refresh signal in response to the refresh command when the count value and a comparison value do not satisfy a predetermined relation, and does not activate the internal refresh signal in response to the refresh command when the count value and the comparison value satisfy the predetermined relation; and a row control circuit that performs a refresh operation on memory cells in response to the internal refresh signal.

According to the present invention, it is determined whether to actually perform a refresh operation based on the count value of the counter circuit that counts repeated inputs of a refresh command, and therefore it is possible to finely adjust a refresh cycle. Further, because of the capability to automatically adjust a refresh cycle in the semiconductor device, a memory controller that controls the semiconductor device is prevented from exercising any complicated control. This enables automatically making a fine adjustment of the refresh cycle according to a temperature change, for example, thereby making it possible to reduce power consumption caused by the refresh operation.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
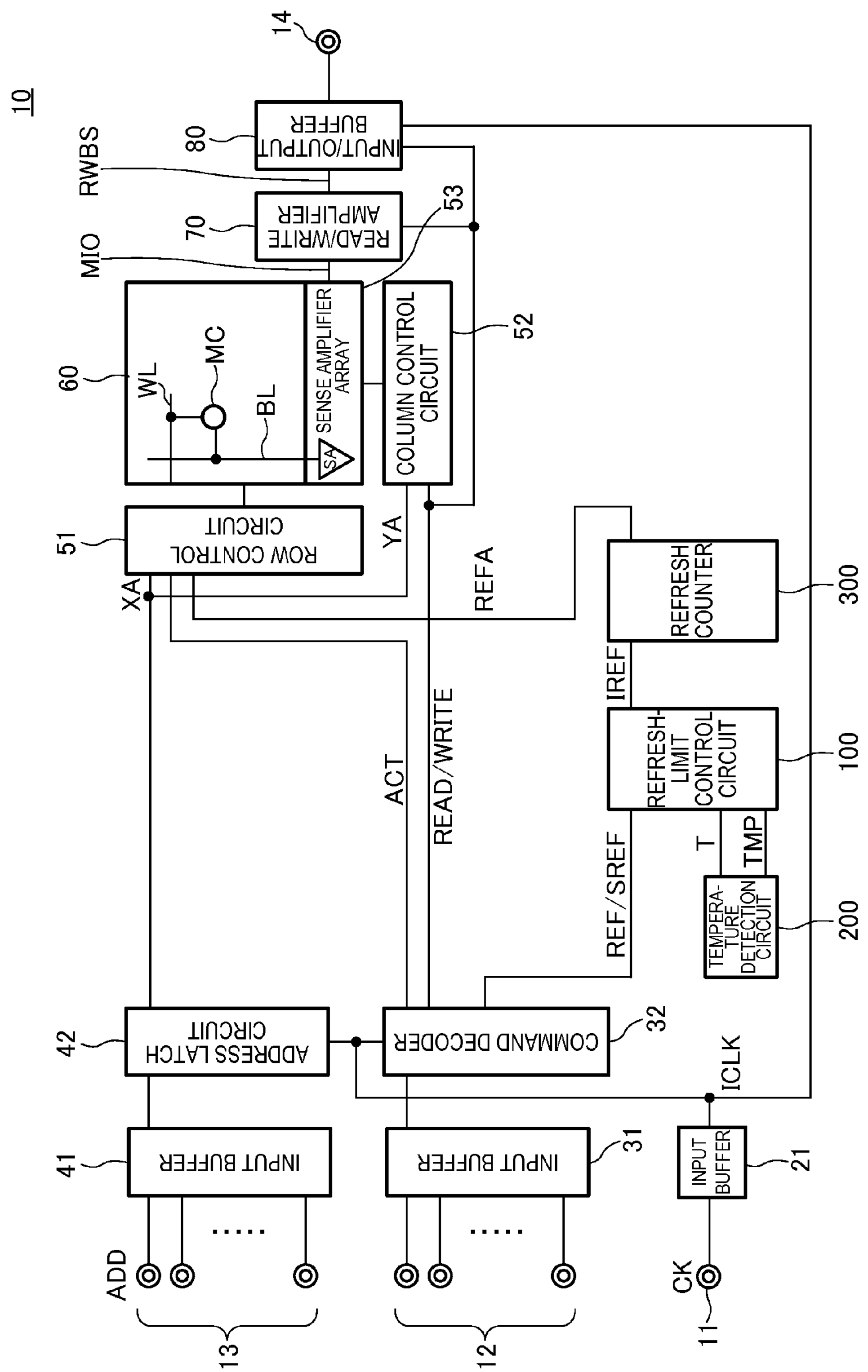
FIG. 1 is a block diagram showing a configuration of a semiconductor device 10 according to an embodiment of the present invention.

FIG. 1 is a block diagram showing a configuration of a semiconductor device 10 according to an embodiment of the present invention.

As shown in FIG. 1, the semiconductor device 10 according to the present embodiment at least includes a clock terminal 11, command terminals 12, address terminals 13, and a data input/output terminal 14 as external terminals.

The clock terminal 11 is a terminal to which a clock signal CK, which is a synchronous signal, is supplied and the clock signal CK supplied to the clock terminal 11 is supplied to an input buffer 21. The input buffer 21 generates an internal clock ICLK and supplies the internal clock ICLK respectively to circuit blocks (described later).

The command terminals 12 are terminals to which such command signals as a row-address strobe signal RAS, a column-address strobe signal CAS, a write enable signal WE, and a chip select signal CS are supplied, respectively. These command signals are supplied to a command decoder 32 via an input buffer 31. The command decoder 32 generates internal commands ICMD of various types by performing holding, decoding, counting or the like on the command signals synchronously with the internal clock ICLK.

The internal commands ICMD include at least an internal active signal ACT, an internal read command READ, an internal write command WRITE, an internal refresh command REF, and an internal self-refresh command SREF. The internal active signal ACT is a signal activated when a command input from outside is an active command. The internal read command READ is a signal activated when a command input from outside is a read command. The internal write command WRITE is a signal activated when a command input from outside is a read command. The internal refresh command REF is a signal activated when a command input from outside is an auto-refresh command. The internal self-refresh command SREF is a signal activated when a command input from outside is a self-refresh command.

The address terminals 13 are terminals to which address signals ADD are supplied, respectively, and the address signals ADD supplied to the address terminals 13 are supplied to an address latch circuit 42 via an input buffer 41. The address latch circuit 42 is a circuit that latches the address signals ADD synchronously with the internal clock ICLK. Among the address signals ADD latched by the address latch circuit 42, a row address XA is supplied to a row control circuit 51 and a column address YA is supplied to a column control circuit 52.

The row control circuit 51 is a circuit selecting one word line WL included in a memory cell array 60. As can be understood from FIG. 1, a plurality of word lines WL and a plurality of bit lines BL intersect in the memory cell array 60 and memory cells MC are arranged at intersecting points, respectively (FIG. 1 shows only one word line WL, one bit line BL, and one memory cell MC). The bit lines BL are respectively connected to corresponding sense amplifiers SA in a sense amplifier array 53.

The column control circuit 52 selects one of the sense amplifiers SA included in the sense amplifier array 53 based on the column address YA. The selected sense amplifier SA is connected to a read/write amplifier 70 via a main I/O wiring MIO. The read/write amplifier 70 functions to amplify read data read from the memory cells MC via the main I/O wiring MIO and to supply the amplified read data to a read/write bus RWBS. The read/write amplifier 70 also functions to supply write data supplied from outside to the memory cells MC via the read/write bus RWBS to the main I/O wiring MIO.

The read/write bus RWBS is connected to an input/output buffer 80. The input/output buffer 80 is a circuit that converts parallel read data into serial read data or that converts serial write data into parallel read data. The read data read out parallel via the read/write bus RWBS is output serially via the data input/output terminal 14. The write data input serially via the data input/output terminal 14 is supplied parallel to the read-write bus RWBS.

The semiconductor device 10 according to the present embodiment also includes a refresh-limit control circuit 100 that receives the internal refresh command REF. The refresh-limit control circuit 100 is a control circuit that determines whether to activate a refresh execution signal IREF in response to activation of the internal refresh command REF. As described later in detail, the determination depends on temperature information T<0:2> output from a temperature detection circuit 200 that measures a chip temperature. The temperature information T<0:2> means a signal constituted by three bits of T0, T1, and T2. Therefore, a maximum value of the temperature information T<0:2> is "111" and a minimum value thereof is "000". In the present embodiment, the temperature information T<0:2> is larger in value at the higher chip temperature. The temperature detection circuit 200 activates a one-shot update signal TMP when changing the temperature information T<0:2>. The number of bits of the temperature information T is not necessarily the number of all bits output from the temperature detection circuit 200 but arbitrarily selected bits from among all the bits output from the temperature detection circuit 200 can be used for the temperature information T. For example, three bits of T<7:9> among T<0:9> can be used for the temperature information T. Needless to say, the number of bits can be set to a natural number other than three.

The refresh execution signal IREF output from the refresh-limit control circuit 100 is supplied to a refresh counter 300. The refresh counter 300 supplies a row address REFA indicated by a count value of the refresh counter 300 to the row control circuit 51 whenever the refresh execution signal IREF is activated, and refreshes all the memory cells MC connected to the corresponding word line WL. Thereafter, the count value of the refresh counter 300 is updated.

The overall configuration of the semiconductor device 10 according to the present embodiment is as described above. The configuration of the semiconductor device 10 and operations performed by the semiconductor device 10 are described in more detail while mainly referring to the refresh-limit control circuit 100.

Figure 2:
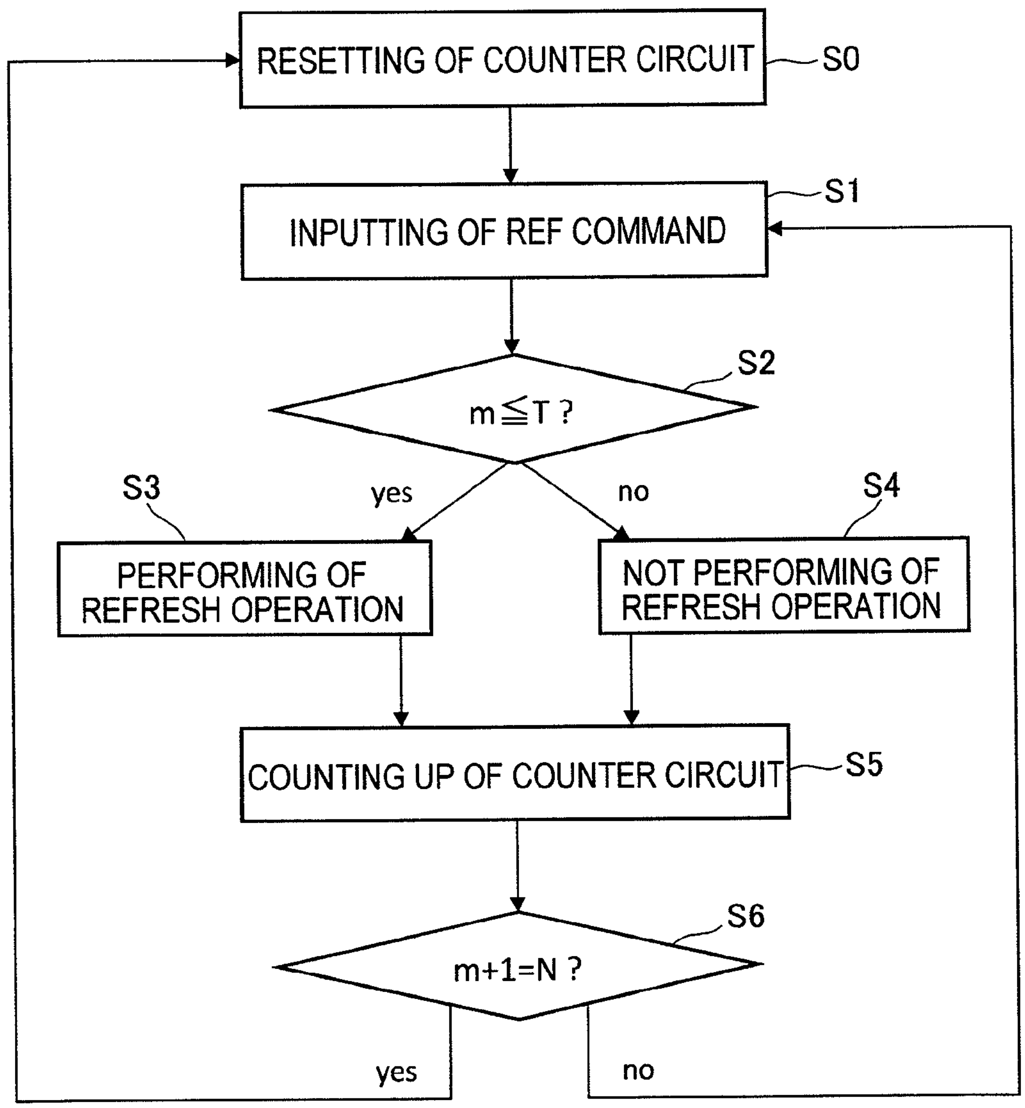
FIG. 2 is a flowchart for explaining an outline of an operation performed by the refresh-limit control circuit 100.

FIG. 2 is a flowchart for explaining an outline of an operation performed by the refresh-limit control circuit 100.

As described later in detail, the refresh-limit control circuit 100 includes a counter circuit 110 that counts issuance of the internal refresh command REF. When the internal refresh command REF is activated (Step S1), the refresh-limit control circuit 100 compares a count value m of the counter circuit 110 with the temperature information T (Step S2). As a result of the comparison, when $m \leq T$, the refresh-limit control circuit 100 generates the refresh execution signal IREF to actually perform a refresh operation (Step S3). On the other hand, when $m > T$, the refresh-limit control circuit 100 does not generate the refresh execution signal IREF, and therefore no refresh operation is performed (Step S4).

The counter circuit 110 counts up (Step S5) and the refresh-limit control circuit 100 determines whether the count value m reaches a maximum value (Step S6). The counter circuit 110 according to the present embodiment is a circuit completed with making one cycle of the count value after the internal refresh command REF is counted N times. Therefore, at Step S6, the refresh-limit control circuit 100 determines whether m+1=N. As a result of the determination, when m+1<N, the operation returns to Step S1 to standby for activation of the internal refresh command REF. When m+1=N, the refresh-limit control circuit 100 resets the count value m to 0 (Step S0). Thereafter, the operation returns to Step S1 to standby for activation of the internal refresh command REF.

Through these steps, in the case of N=8 and T=5, for example, after the counter circuit 110 is reset, the refresh execution signal IREF is activated in response to each of first to sixth internal refresh commands REF but is not activated in response to each of seventh and eighth refresh commands REF. This means that even when the auto-refresh command is input from outside eight times, six refresh operations are actually performed and two refresh operations are thinned out. Accordingly, the refresh cycle extends to $4/3$ (=$8/6$).

Figure 3:
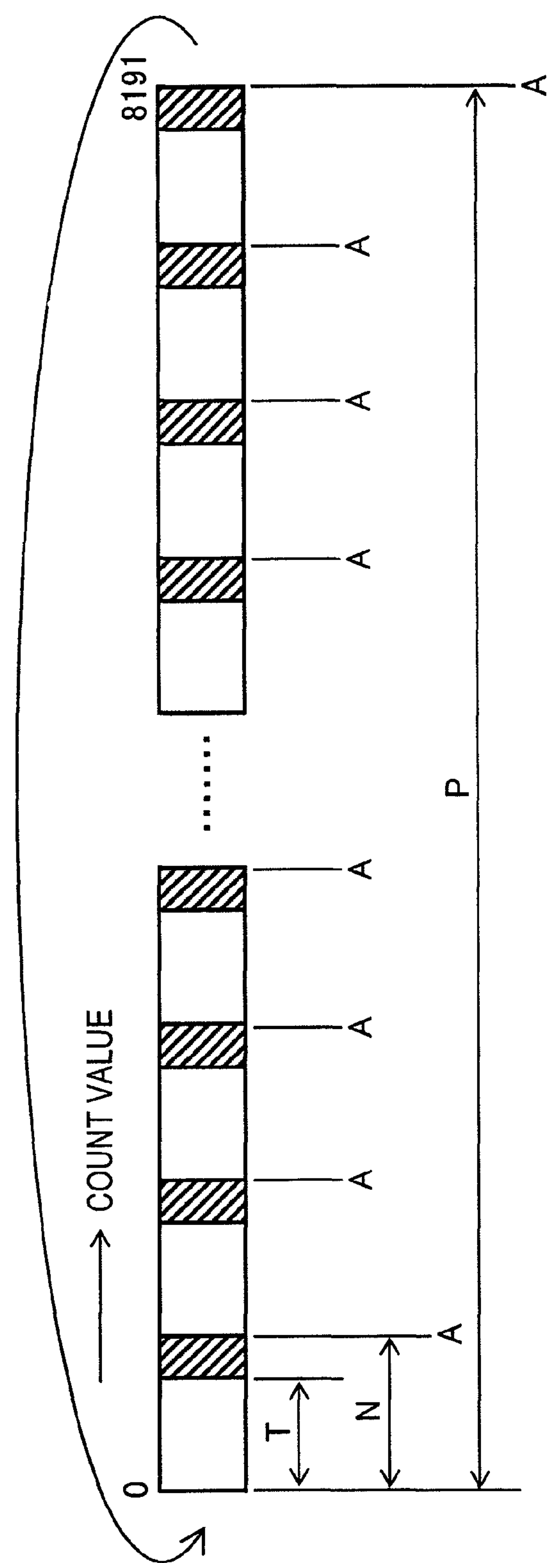
FIG. 3 is a pattern diagram for explaining an operation performed by the refresh-limit control circuit 100.

FIG. 3 is a pattern diagram for explaining an operation performed by the refresh-limit control circuit 100. Count values 0 to 8191 shown in FIG. 3 correspond to those of the refresh counter 300 included in a memory controller (not shown). In FIG. 3, symbol P denotes the number of times of repeated inputs of the auto-refresh command within the period (64 ms) specified according to the standards. By way of example, the count P satisfies P=8192 or $P=2^p$ (p=13) when expressed in the form of the power of 2. In this case, when the auto-refresh command is issued 8192 times, the refresh counter 300 included in the memory controller is completed with making one cycle of the count value after the auto-refresh command is issued 8192 times and returns the count value to 0.

As explained in the example, provided that N=8 ($N=2^n$ (n=3) when 8 is expressed in the form of the power of 2), the refresh operation is performed when the count value of the counter circuit 110 is in a range from 0 to T, and the refresh operation is not performed when the count value of the counter circuit 110 exceeds T. In FIG. 3, a non-hatched region indicates a first state where the refresh operation is performed in response to activation of the internal refresh command REF, and a hatched region indicates a second state where no refresh operation is performed in response to activation of the internal refresh command REF. Therefore, the first and second states are repeated whenever the counter circuit 110 makes one cycle. Because the width of the hatched region (the second state) is variable according to the temperature information, the refresh cycle can be adjusted finely based on the chip temperature.

Figure 4:
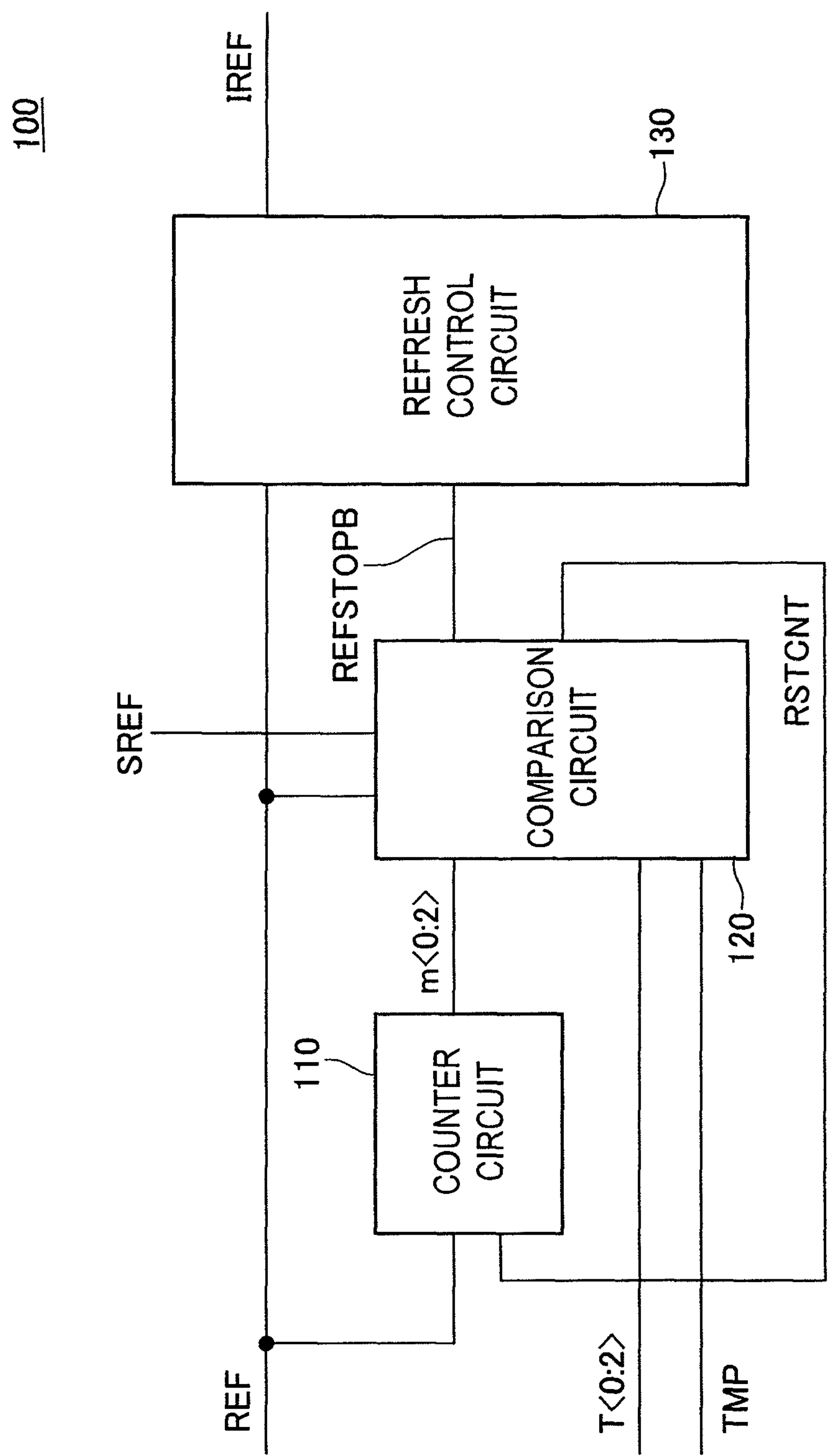
FIG. 4 is a block diagram showing a configuration of the refresh-limit control circuit 100.

FIG. 4 is a block diagram showing a configuration of the refresh-limit control circuit 100.

As shown in FIG. 4, the refresh-limit control circuit 100 includes the counter circuit 110, a comparison circuit 120, and a refresh control circuit 130. The counter circuit 110 is a circuit that counts issuance of the internal refresh command REF and supplies the count value m<0:2> to the comparison circuit 120. The count value m<0:2> means herein a signal constituted by three bits of m0, m1, and m2.

The comparison circuit 120 is a circuit that compares the count value m<0:2> with the temperature information T<0:2>. The comparison circuit 120 activates a stop signal REFSTOPB when the count value m<0:2> matches the temperature information T<0:2>. The stop signal REFSTOPB is activated to a low level. As described later in detail, the stop signal REFSTOPB is kept active until predetermined conditions are met. As shown in FIG. 4, the comparison circuit 120 supplies the stop signal REFSTOPB to the refresh control circuit 130.

The refresh control circuit 130 is a circuit that generates the refresh execution signal IREF based on the internal refresh command REF. When the comparison circuit 120 does not activate the stop signal REFSTOPB, the refresh control circuit 130 activates the refresh execution signal IREF in response to activation of the internal refresh command REF. When the comparison circuit 120 activates the stop signal REFSTOPB, the refresh control circuit 130 does not activate the refresh execution signal IREF even when the internal refresh command REF is activated.

The respective circuit blocks constituting the refresh-limit control circuit 100 are described next in more detail.

Figure 5:
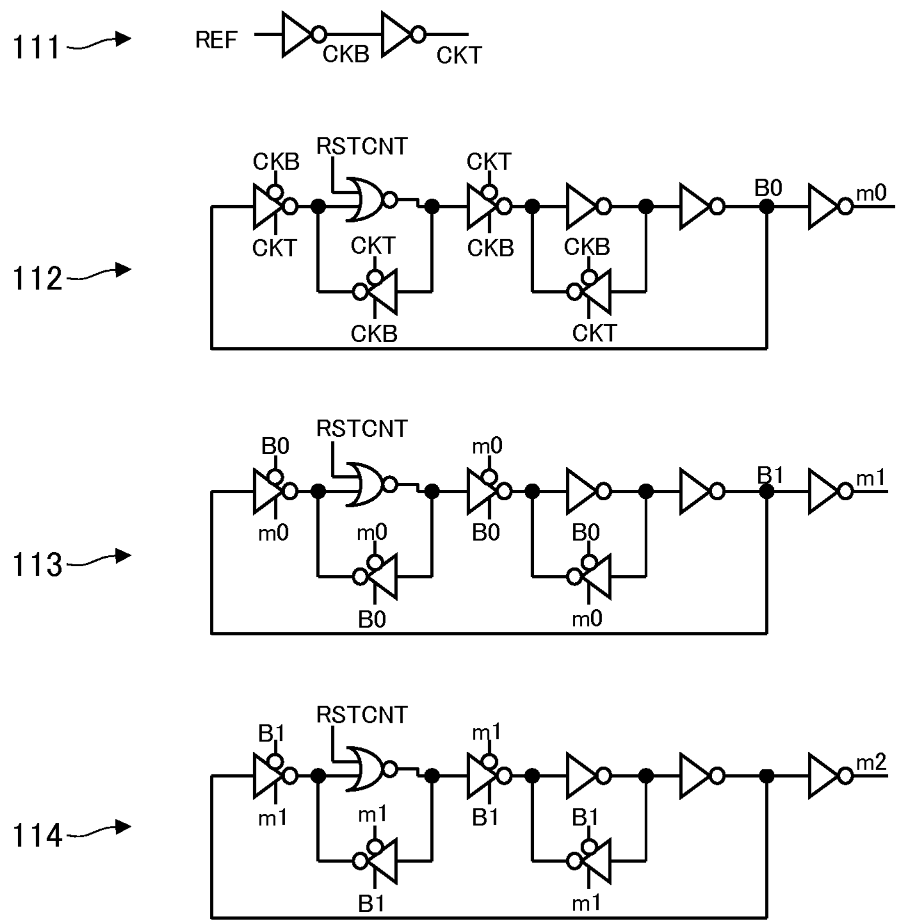
FIG. 5 is a circuit diagram of the counter circuit 110.

FIG. 5 is a circuit diagram of the counter circuit 110.

As shown in FIG. 5, the counter circuit 110 includes a clock generation unit 111 that generates complementary signals CKB and CKT based on the internal refresh command REF, and bit generation circuits 112 to 114 that generate the bits of the count value m<0:2>, respectively.

The bit generation circuit 112 is a circuit that generates the least significant bit m0 of the count value m<0:2> and inverts the bit m0 whenever the clock signals CKB and CKT change. The bit generation circuit 113 is a circuit that generates the second bit m1 of the count value m<0:2> and inverts the bit m1 whenever the bit m0 and an inversion signal B0 of the bit m0 change. The bit generation circuit 114 is a circuit that generates the most significant bit m2 of the count value m<0:2> and inverts the bit m2 whenever the bit m1 and an inversion signal B1 of the bit m1 change.

As shown in FIG. 5, a reset signal RSTCNT is supplied to each of these bit generation circuits 112 to 114. When the reset signal RSTCNT is activated to a high level, then the bits constituting the count value m<0:2> are all set at a low level and the count value m<0:2> is reset to the minimum value "000".

Figure 6:
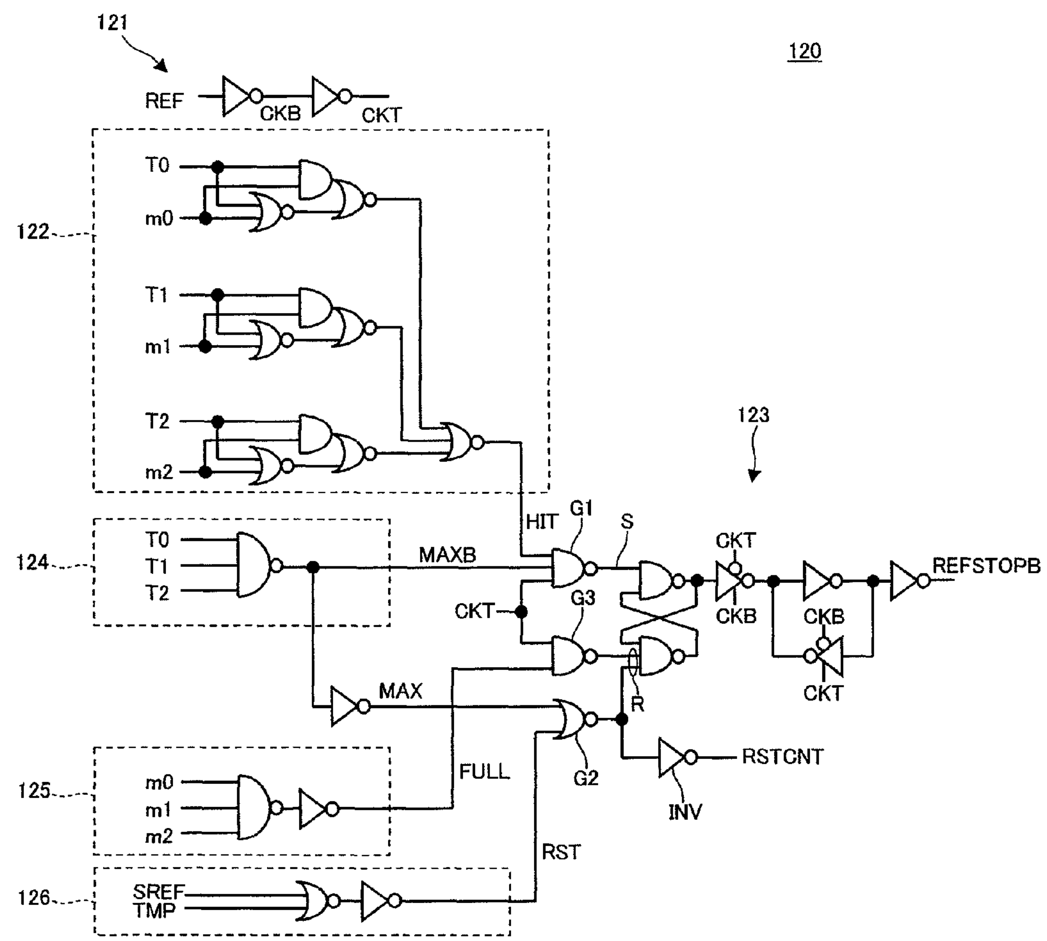
FIG. 6 is a circuit diagram of the comparison circuit 120.

FIG. 6 is a circuit diagram of the comparison circuit 120.

As shown in FIG. 6, the comparison circuit 120 includes a clock generation unit 121 that generates the complementary signals CKB and CKT based on the internal refresh command REF, a match detection circuit 122 that detects that the count value m<0:2> matches the temperature information T<0:2>, an SR latch circuit 123 set according to an output from the match detection circuit 122, and reset circuits 124 to 126 resetting the SR latch circuit 123. When the SR latch circuit 123 is set, the comparison circuit 120 activates the stop signal REFSTOPB which is an output of the comparison circuit 120 to a low level. Conversely, when the SR latch circuit 123 is reset, the comparison circuit 120 inactivates the stop signal REFSTOPB to a high level.

The match detection circuit 122 is a circuit that compares logic levels of the bits m0, m1, and m2 constituting the count value m<0:2> with those of the bits T0, T1, and T2 constituting the temperature information T<0:2>, respectively, and activates the match signal HIT to a high level when the logic levels of the bits m0, m1, and m2 match those of the bits T0, T1, and T2, respectively. The match detection circuit 122 supplies the match signal HIT to a set input terminal S of the SR latch circuit 123 via a NAND gate circuit G1. An indication signal MAXB output from the reset circuit 124 and the clock signal CKT as well as the match signal HIT are supplied to input terminals of the NAND gate circuit G1. Accordingly, when the match detection circuit 122 activates the match signal HIT to a high level, the SR latch circuit 123 is set on the condition that the indication signal MAXB and the clock signal CKT are at a high level. In this way, the match detection circuit 122 functions to set the SR latch circuit 123 in response to matching of the count value m to the temperature information T and to cause the SR latch circuit 123 to activate the stop signal REFSTOPB.

The reset circuit 124 is configured to include a NAND gate circuit that receives the bits T0, T1, and T2 constituting the temperature information T<0:2>. Accordingly, when the bits T0, T1, and T2 are all at a high level, in other words, when the temperature detection circuit 200 determines that the chip temperature indicates the maximum value, the indication signal MAXB output from the reset circuit 124 is at a low level. Otherwise, the indication signal MAXB is at a high level. Accordingly, the SR latch circuit 123 is not set when the chip temperature indicates the maximum value despite the match signal HIT is activated. Conversely, an indication signal MAX output from the reset circuit 124 is at a high level when the chip temperature indicates the maximum value. Accordingly, an output from a NOR gate G2 is at a low level and the SR latch circuit 123 is reset.

The reset circuit 124 is provided to block the SR latch circuit 123 from being set when the temperature information T<0:2> indicates the maximum value. That is, when the temperature information T<0:2> is "111", the match detection circuit 122 outputs the match signal HIT when the count value m<0:2> is "111". When the temperature information T<0:2> indicates the maximum value "111", there is no need to thin out repeated inputs of the internal refresh command REF. Therefore, it is necessary to invalidate the match signal HIT activated in that case.

The reset circuit 125 is configured to include an AND gate circuit that receives the bits m0, m1, and m2 constituting the count value m<0:2>. Accordingly, when the bits m0, m1, and m2 are all at a high level, in other words, when the count value m of the counter circuit 110 indicates the maximum value, an indication signal FULL output from the reset circuit 125 is at a high level. Otherwise, the indication signal FULL is at a low level. The reset circuit 125 supplies the indication signal FULL to a reset input terminal R of the SR latch circuit 123 via a NAND gate circuit G3. The clock signal CKT as well as the indication signal FULL is supplied to an input terminal of the NAND gate G3. Accordingly, when the reset circuit 125 activates the indication signal FULL to a high level, the SR latch circuit 123 is reset on the condition that the clock signal CKT is at a high level.

The reset circuit 125 functions to reset the SR latch circuit 123 before the counter circuit 110 makes one cycle to return the count value m to the minimum value "000". That is, the reset circuit 125 functions to reset the SR latch circuit at every timing A shown in FIG. 3. Therefore, in a normal operation state, the match signal HIT output from the match detection circuit 122 and the indication signal FULL output from the reset circuit 125 are alternately activated based on the magnitude relation between the count value m and the temperature information T. Accordingly, when the SR latch circuit 123 is set in response to activation of the match signal HIT, the SR latch circuit 123 is kept set until the indication signal FULL is activated. The "normal operation state" means herein a state where the temperature information T does not indicate the maximum value, the internal self-refresh command SREF is not activated, and where the update signal TMP is not activated.

The reset circuit 126 is configured to include an OR gate circuit that receives the internal self-refresh command SREF and the update signal TMP. Therefore, when at least one of the internal self-refresh command SREF and the update signal TMP is at a high level, an indication signal RST output from the reset circuit 126 is at a high level. Accordingly, the output from the NOR gate G2 is at a low level and the SR latch circuit 123 is reset.

The reset circuit 126 functions to reset the SR latch circuit 123 when the semiconductor device 10 enters a self-refresh mode or when the value of the temperature information T<0:2> changes. When the semiconductor device 10 enters the self-refresh mode or when the value of the temperature information T<0:2> changes, control conditions for the refresh operation greatly change. Therefore, it is effective to return to the starting point once.

As shown in FIG. 6, an inverter INV inverts the output from the NOR gate circuit G2 and the inverted output from the inverter INV is used as the reset signal RSTCNT. The comparison circuit 120 supplies the reset signal RSTCNT to the counter circuit 110 shown in FIG. 5. As described above, when the reset signal RSTCNT is activated to a high level, the count value m is reset to the minimum value "000". Accordingly, the reset signal RSTCNT is activated when the temperature information T<0:2> indicates the maximum value, when the semiconductor device 10 enters the self-refresh mode or when the value of the temperature information T<0:2> changes. As described above, when the temperature information T<0:2> indicates the maximum value, there is no need to thin out the repeated inputs of the internal refresh command REF. When the semiconductor device 10 enters the self refresh mode or when the value of the temperature information T<0:2> changes, the control conditions for the refresh operation greatly changes. Therefore, it is effective to return to the starting point once.

Figure 7:
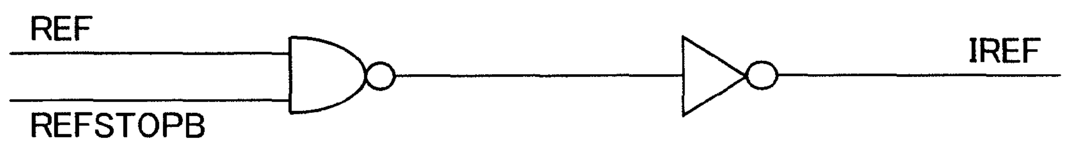
FIG. 7 is a circuit diagram of the refresh control circuit 130.

The output from the SR latch circuit 123 is used as the stop signal REFSTOPB. As shown in FIG. 4, the comparison circuit 120 supplies the stop signal REFSTOPB to the refresh control circuit 130. FIG. 7 is a circuit diagram of the refresh control circuit 130. As shown in FIG. 7, the refresh control circuit 130 is configured to include an AND gate circuit that receives the internal refresh command REF and the stop signal REFSTOPB. Therefore, when the stop signal REFSTOPB is inactivated to a high level, the refresh control circuit 130 activates the refresh execution signal IREF whenever the internal refresh command REF is activated. When the stop signal REFSTOPB is activated to a low level, the refresh control circuit 130 does not activate the refresh execution signal IREF even when the internal refresh command REF is activated.

The configuration of the semiconductor device 10 according to the present embodiment is as described above. An operation of the semiconductor device 10 is described next.

Figure 8:
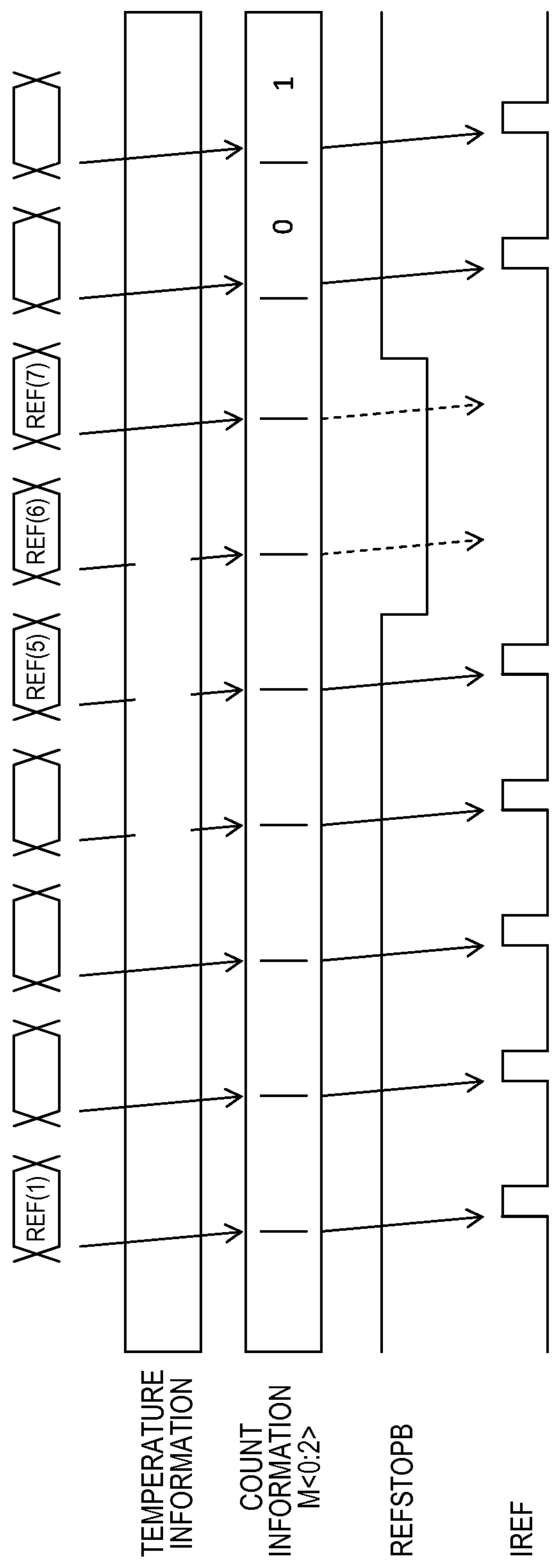
FIG. 8 is a timing diagram for explaining an example of an operation performed by the semiconductor device 10.

FIG. 8 is a timing diagram for explaining an example of an operation performed by the semiconductor device 10 according to the present embodiment. FIG. 8 shows an operation when the temperature information T<0:2> is "101", that is, "5" in decimal representation.

As shown in FIG. 8, when the auto-refresh command is input from outside, the command decoder 32 included in the semiconductor device 10 activates the internal refresh command REF. The counter circuit 110 counts the internal refresh command REF and increments the count value m<0:2>. In the example of FIG. 8, the temperature information T<0:2> is "5" in decimal representation. Accordingly, when the count value m<0:2> is equal to or smaller than "4" in decimal representation, the SR latch circuit 123 is kept reset and thus the stop signal REFSTOPB is set at a high level. In this state, the refresh execution signal IREF is activated whenever the internal refresh command REF is activated. In the example of FIG. 8, the refresh execution signal IREF is activated in response to activation of each of the first internal refresh command REF(1) to the fifth internal refresh command REF (5).

When the count value m<0:2> of the counter circuit 110 reaches "5" in decimal representation, the match signal HIT output from the comparison circuit 120 is activated to a high level and thus the SR latch circuit 123 is set. In the example of FIG. 8, the SR latch circuit 123 is set in response to activation of the fifth internal refresh command REF(5) and the stop signal REFSTOPB changes to a low level.

Accordingly, even when the sixth internal refresh command REF(6) and the seventh internal refresh command REF (7) are activated, the refresh execution signal IREF is not activated. That is, two inputs of internal refresh command REF are omitted.

When the count value m<0:2> of the counter circuit 110 reaches "7" in decimal representation, that is, reaches "111" in binary representation in response to activation of the seventh internal refresh command REF(7), the indication signal FULL output from the reset circuit 125 is at a high level. The SR latch circuit 123 is thereby reset back to an initial state. Therefore, the refresh execution signal IREF is activated in response to activation of each of eighth and following internal refresh commands REF.

In this way, when the temperature information T<0:2> is "5" in decimal representation and the count value m<0:2> of the counter circuit 110 is "0" to "5" in decimal representation, the refresh execution signal IREF is activated in response to activation of the internal refresh command REF. When the temperature information T<0:2> is "6" to "7" in decimal representation, the refresh execution signal IREF is not activated in response to activation of the internal refresh command REF. As a result, even when the auto-refresh command is input eight times from outside, only six refresh operations are performed in the semiconductor device 10. Accordingly, refresh frequency decreases to $\frac{3}{4}$ (=$\frac{6}{8}$) and the refresh cycle extends to $\frac{4}{3}$ (=$\frac{8}{6}$).

Figure 9:
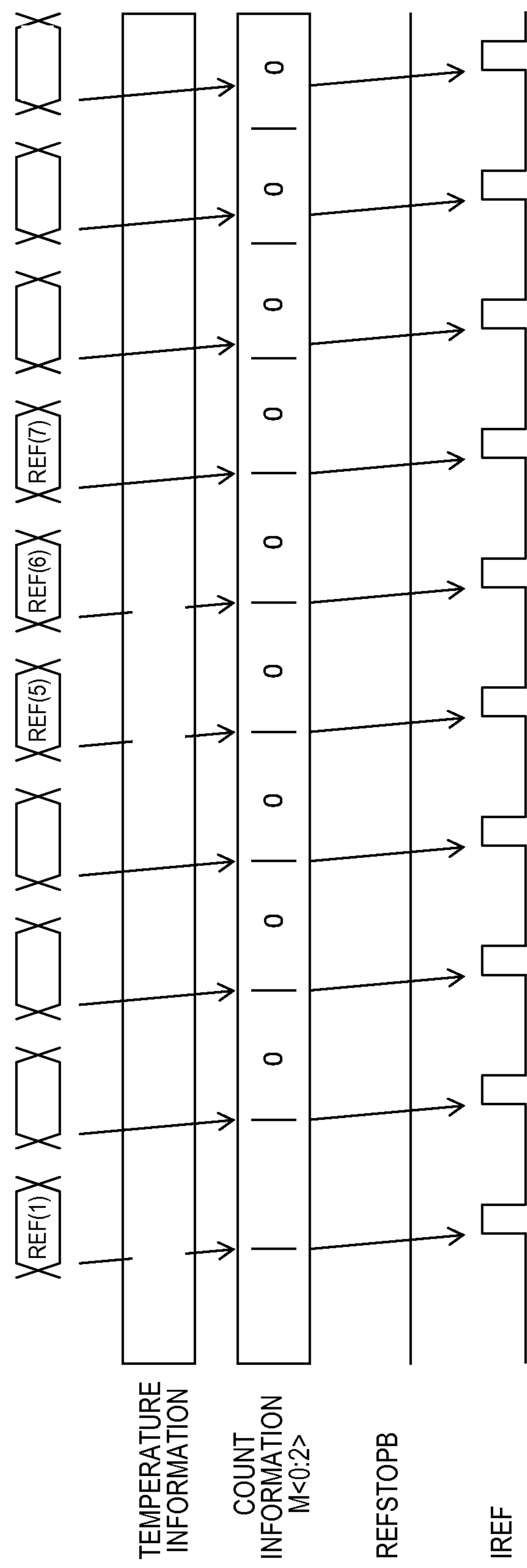
FIG. 9 is a timing diagram for explaining another example of an operation performed by the semiconductor device 10.

FIG. 9 is a timing diagram for explaining another example of an operation performed by the semiconductor device 10 according to the present embodiment. FIG. 9 shows an operation when the temperature information T<0:2> is "111", that is, "7" in decimal representation.

When the temperature information T<0:2> is the maximum value "111", that is, "7" in decimal representation, the indication signal MAX output from the reset circuit 124 shown in FIG. 6 is at a high level. Accordingly, the SR latch circuit 123 is reset and the reset signal RSTCNT is activated. Therefore, the stop signal REFSTOPB is always at a high level and the refresh execution signal IREF is activated whenever the internal refresh command REF is activated.

In this way, according to the present embodiment, when the temperature information T<0:2> indicates the maximum value "111", the reset circuit 125 prohibits the SR latch circuit 123 from being set and resets the SR latch circuit 123 although the SR latch circuit 123 is originally set when the count value m<0:2> indicates "111". Therefore, it is possible to prevent the repeated inputs of the internal refresh command REF from being erroneously thinned out.

The case where the value of the temperature information T is larger at a higher chip temperature has been described by way of example. However, the relation between the chip temperature and the temperature information T can be set oppositely. That is, the semiconductor device 10 can be configured so that the value of the temperature T is smaller at a higher temperature. In this case, reverse-phase signals with respect to the signals for the temperature information T<0:2> are input to T0 to T2 shown in FIG. 6, respectively, and a stop signal REFSTOP in a reversed phase with respect to the stop signal REFSTOPB shown in FIG. 8 can be used in place of the stop signal REFSTOPB.

As described above, in the semiconductor device 10 according to the present embodiment, the repeated inputs of the auto-refresh command from outside are thinned out based on the temperature information T<0:2> output from the temperature detection circuit 200. Therefore, it is possible to automatically make a fine adjustment of the refresh cycle in the auto-refresh mode. This can minimize the refresh frequency, and therefore can reduce the power consumption caused by the refresh operation. It is also possible to prevent the memory controller that controls the semiconductor device 10 from exercising any complicated control because it suffices to issue the auto-refresh command by the number of times (such as 8192 times) set within the period (such as 64 ms) specified according to the standards similarly to an ordinary semiconductor device.

It is apparent that the present invention is not limited to the above embodiments, but may be modified and changed without departing from the scope and spirit of the invention.

For example, in the above embodiment, the refresh cycle is adjusted at 8 (=$2^3$) stages by setting the number of bits of each of the temperature information T and the count value m to three. However, the number of bits of each of the temperature information T and the count value m according to the present invention is not limited to a specific number. Therefore, it suffices to set the number of bits of each of the temperature information T and the count value m to be equal to or larger than four when a finer adjustment is to be made.

In the above embodiment, the match signal HIT is activated when the temperature information T matches the count value m (that is, T−m=0). However, the condition for activating the match signal HIT is not limited to matching of the temperature information T to the count value m. Alternatively, the match signal HIT can be activated when the temperature information T and the count value m satisfy a predetermined relation. For example, the match signal HIT can be activated when the condition of T−m=2 is satisfied. In this case, it suffices to shift the condition where the reset circuit 125 activates the command signal FULL by two counts.

Furthermore, in the above embodiment, there has been described an example in which the repeated inputs of the auto-refresh command from outside are thinned out according to a chip temperature; however, the present invention is not limited to this example, and the repeated inputs of the auto-refresh command can be thinned out according to other parameters.

In addition, embodiments of the disclosed semiconductor device may include the following elements, alone or in combination.

A counter circuit that updates a count value thereof each time a refresh command is issued, the refresh command being issued P times, where P is an integer, in a predetermined period, and the count value being reset each time the refresh command is issued N times, where N is an integer smaller than P.

A refresh control circuit that activates an internal refresh signal in response to the refresh command when the count value and a comparison value do not satisfy a predetermined relation, and does not activate the internal refresh signal in response to the refresh command when the count value and the comparison value satisfy the predetermined relation.

A row control circuit that performs a refresh operation on memory cells in response to the internal refresh signal.

The predetermined relations may be a magnitude relation between the count value and the comparison value.

The comparison value may be automatically generated within the semiconductor device.

The semiconductor device may further include a temperature detection circuit that generates the comparison value based on an internal temperature of the semiconductor device.

P may be the p-th power of 2, where p is an integer, and N may be the n-th power of 2, where n is an integer smaller than p.

What is claimed is:

1. A semiconductor device comprising:

a temperature detection circuit that generates a temperature code based on a temperature of the semiconductor device;

a counter circuit that updates a count value thereof each time a refresh command is issued;

a comparison circuit that activates a match signal when the count value is coincident with a value of the temperature code; and a refresh control circuit that controls based on the match signal whether to perform a refresh operation in response to the refresh command.

2. The semiconductor device as claimed in claim 1, wherein the comparison circuit includes an SR latch circuit that is set in response to the match signal, and the refresh control circuit controls, based on an output from the SR latch circuit, whether to perform the refresh operation in response to the refresh command.

3. The semiconductor device as claimed in claim 2, wherein the SR latch circuit is reset when the count value indicates a predetermined value.

4. The semiconductor device as claimed in claim 2, wherein the SR latch circuit is reset when the temperature code is changed.

5. The semiconductor device as claimed in claim 2, wherein the SR latch circuit is reset when a predetermined signal is supplied from outside.

6. The semiconductor device as claimed in claim 5, wherein the predetermined signal includes a self-refresh command.

7. The semiconductor device as claimed in claim 2, wherein the SR latch circuit is reset irrespectively of the count value when the temperature code indicates a predetermined value.

8. The semiconductor device as claimed in claim 2, wherein the refresh control circuit prohibits the refresh operation in response to the refresh command when the SR latch circuit is set.

9. The semiconductor device as claimed in claim 2, wherein the refresh control circuit prohibits the refresh operation in response to the refresh command when the SR latch circuit is reset.

10. A semiconductor device comprising:

a temperature detection circuit that generates a temperature code based on a temperature of the semiconductor device;

a counter circuit that updates a count value thereof each time a refresh command is issued;

a comparison circuit that activates a match signal when the count value is coincident with a value of the temperature code; and a refresh control circuit that performs a refresh operation when the refresh command is issued in a first operation mode and does not perform the refresh operation even when the refresh command is issued in a second operation mode, an operation mode of the refresh control circuit being changed from one of the first and second operation modes to other one of the first and second operation modes when the match signal is activated.

11. The semiconductor device as claimed in claim 10, wherein the operation mode of the refresh control circuit is changed from one of the first and second operation modes to another one of the first and second operation modes when the count value indicates a predetermined value.

12. The semiconductor device as claimed in claim 10, wherein the operation mode of the refresh control circuit is changed to the first operation mode when the temperature code is changed.

13. The semiconductor device as claimed in claim 10, wherein the operation mode of the refresh control circuit is changed to the first operation mode when a predetermined signal is supplied from outside.

14. The semiconductor device as claimed in claim 10, wherein the operation mode of the refresh control circuit is changed to the first operation mode irrespectively of the count value when the temperature code indicates a predetermined value.

15. A semiconductor device comprising:

a counter circuit updating a count value thereof each time a refresh command is issued, the count value being recurrently updated from a first value to a second value;

a temperature detection circuit generating a temperature code related to an operating temperature of the semiconductor device, the temperature code taking as a value thereof one of the first value, second value, and intermediate values between the first and second values; and a control circuit determining whether or not a refresh operation responsive to the refresh command is performed based on the count value and the temperature code.

16. The semiconductor device as claimed in claim 15, wherein the refresh operation is determined to be performed when the count value is updated by an issuance of the refresh command in a range between the first value and the value of the temperature code and not to be performed when the count value is updated by an issuance of the refresh command in a range between the second value and the value of the temperature code.

17. The semiconductor device as claimed in claim 15, further comprising a refresh counter circuit outputting a refresh address to which the refresh operation is to be performed, the refresh counter circuit updating the refresh address when the control circuit determines that the refresh operation responsive to the refresh command is to be performed, and maintaining the refresh address when the control circuit determines that the refresh operation responsive to the refresh command is not to be performed.

18. The semiconductor device as claimed in claim 15, further comprising:

a plurality of external command terminals; and a command decoder coupled to the external command terminals to receive a plurality of command signals, and the command decoder issuing the refresh command in response to the command signals.

19. The semiconductor device as claimed in claim 15, wherein the value of the temperature code moves toward the second value when the operating temperature rises and the value of the temperature code moves toward the first value when the operating temperature becomes lower.

* * * * *